US007271545B2

(12) United States Patent
Hu et al.

(10) Patent No.: US 7,271,545 B2
(45) Date of Patent: Sep. 18, 2007

(54) BALLAST AND IGNITER FOR A LAMP HAVING LARGER STORAGE CAPACITOR THAN CHARGE PUMP CAPACITOR

(75) Inventors: Yuequan Hu, Morrisville, NC (US); Milan M. Jovanović, Cary, NC (US); Yuan Chao Niu, Taipei (TW); Colin Weng, Taipei (TW)

(73) Assignee: Delta Electronics, Inc., Taipei (TW)

( * ) Notice: Subject to any disclaimer, the term of this patent is extended or adjusted under 35 U.S.C. 154(b) by 0 days.

(21) Appl. No.: 11/245,445

(22) Filed: Oct. 7, 2005

(65) Prior Publication Data

US 2007/0080651 A1 Apr. 12, 2007

(51) Int. Cl.
*H05B 37/02* (2006.01)
*H03L 7/06* (2006.01)

(52) U.S. Cl. ............................. 315/209 CD; 315/274; 315/224; 315/209 R; 315/209 T; 327/148; 327/157; 327/145; 327/146

(58) Field of Classification Search ......... 315/209 CD, 315/209 T, 290 M, 224, 225, 209 R, 274, 315/276, 279, 282; 327/148, 145, 146, 157
See application file for complete search history.

(56) References Cited

U.S. PATENT DOCUMENTS 6,188,180 B1 2/2001 Diamond
6,437,518 B1 8/2002 Ito et al.
2004/0113569 A1 * 6/2004 Henry ........................ 315/307
2004/0130273 A1 * 7/2004 Alexandrov ................ 315/291
2005/0110431 A1 * 5/2005 Ben-Yaakov ................ 315/291

OTHER PUBLICATIONS

Kyu-Chan, et al., "Design and Analysis of Automotive High Intensity Discharge Lamp Ballast Using Micro Controller Unit", IEEE Transactions on Power Electronics, pp. 1356-1364, vol. 18, No. 6, Nov. 2003.

* cited by examiner

*Primary Examiner*—Tuyet Vo
(74) *Attorney, Agent, or Firm*—Venable LLP; Robert S. Babayi

(57) ABSTRACT

A ballast according to the present invention operates in an ignition state, a warm-up state, and a steady state for igniting and powering a lamp. The ballast comprises an igniter that ignites the lamp during the ignition state and a switching power inverter, for example, a full bridge DC-AC inverter implemented with MOSFET switching transistors, that powers the lamp during the warm-up and steady states. The switching power inverter, which drives the igniter, operates at a first switching frequency during the ignition state and operates at a second switching frequency during the steady state. Preferably, the first switching frequency, which in one exemplary embodiment is in the kHz range, is higher than the second switching frequency.

10 Claims, 10 Drawing Sheets

BALLAST AND IGNITER FOR A LAMP HAVING LARGER STORAGE CAPACITOR THAN CHARGE PUMP CAPACITOR

BACKGROUND OF THE INVENTION

1. Field of the Invention

This invention relates to a ballast and, more particularly, to a ballast that ignites and powers lamps, such as high-intensity-discharge (HID) lamps.

2. Description of the Prior Art

HID lamps include the groups of electrical lights commonly known as mercury vapor, metal halide, high-pressure sodium, and xenon short-arc lamps. Compared to fluorescent and incandescent lamps, HID lamps produce a large quantity of light in a small package.

HID lamps operate by striking an electrical arc during an ignition state and remain turned on to provide lighting during a steady state. The arc is applied across electrodes housed inside a specially designed inner fused quartz or fused alumina tube filled with both gas and metals. The gas aids in starting the lamps during the ignition state. Then, during the steady state, electric power is applied to metals to produce the light once they are heated to a point of evaporation. Like fluorescent lamps, HID lamps use a ballast to ignite and maintain steady state operation.

Known ballasts use electromagnetic induction to provide the proper starting and operating electrical condition to ignite and power the HID lamps. In order to ignite an HID lamp, a relatively high starting voltage of about 25 kV is applied across electrodes of the lamp during the ignition state to place the gases into a suitable ionized condition for striking a glow breakdown. Once ignited, the power applied to the metal terminals of the HID lamp operates it at the warm-up state and steady state to turn on the lamp and provide lighting.

FIG. 1 shows a known ballast for igniting and powering the HID lamp. The ballast receives an input voltage, Vo, of approximately 380 V before ignition of the lamp, and 65 V to 125V after ignition. Typically, the ballast input voltage Vo is provided from a step-up DC-DC voltage converter, such as a flyback converter, that converts a low DC voltage, e.g., 12 V, to the ballast input voltage, Vo. As shown in FIG. 1, the ballast input voltage, Vo, is applied to a switching power inverter comprising a micro-controlled full-bridge DC/AC switching converter that is implemented by switches Q1, Q2, Q3 and Q4 and a full bridge driver. Normally, the power inverter operates at a switching frequency of 100 Hz-500 Hz to avoid acoustic resonance.

A ballast also includes an igniter for generating a high voltage arc based on voltage stored in one or more capacitors. In general, high voltages are desirable for generating the arc since the energy stored in the energy storage capacitor is $C \cdot V^2/2$, where C and V are the capacitance and voltage of the capacitor, respectively. Also higher charge voltages permit a reduction in the capacitor size while maintaining a constant amount of stored energy. In order to provide higher charge voltages, voltage multipliers have been commonly used in the igniter of the ballast.

The ballast of FIG. 1 also includes an igniter comprising a high voltage pulse transformer HV_XFMR that generates a high striking voltage to initiate an ignition arc. The igniter shown in FIG. 1 has a voltage doubler comprising two diodes, D1 and D2, two same sized capacitors, C1 and C2, and two current limiting resistors, R5 and R6. When switches Q1 and Q3 are turned on according to the power inverter's switching frequency, the voltage across terminals A and B becomes positive and capacitor C1 is charged through resistor R5 and diode D1. When switch Q2 and Q4 are turned on at the switching frequency, the voltage across terminals A and B becomes negative and capacitor C2 is charged through resistor R6 and diode D2. Both capacitors C1 and C2 are finally charged to the voltage Vo for a total break-over voltage of 2*Vo. When the voltage across capacitors C1 and C2 reaches the break-over voltage, a spark gap, SG, breaks over and generates a pulse across the primary winding of the pulse transformer HV_XFMR. As a result, a high voltage pulse is generated across the secondary winding igniting the HID lamp.

Once the HID lamp is ignited, the ballast provides required constant power to the HID lamp during its steady state operation at the same switching frequency of the full-bridge DC/AC inverter as the one used to ignite the HID lamp. Immediately after ignition of the HID lamp, a DC or AC warm-up with a switching frequency of several tens of Hz for the power inverter is usually needed to shorten the time to full light output of the HID lamp. During the warm-up interval, the HID lamp is operated with a much higher power. For a 35 W HID lamp, the warm-up power can be as high as 75 W.

The major drawback of the ballast of FIG. 1 is that the effective capacitance of capacitor C1 in series with capacitor C2 is half of the individual capacitance of capacitors C1 and C2, assuming C1=C2. As a result, the utilization of the total energy storage capacity of C1 and C2 is only 50%, which has detrimental effect on the size of the igniter. Another disadvantage is that the firing of the primary winding is not synchronized to the turn on instant of Q1 and Q3, or Q2 and Q4. Therefore, the secondary winding cannot be arranged so that the generated pulse is in phase with the ballast input voltage, Vo, which prevents optimized ignition of the HID lamp.

FIG. 2 shows another prior art ballast disclosed in U.S. Pat. No. 6,437,518. The ballast of FIG. 2 receives a high input voltage of around 380 V from a flyback converter having a transformer winding (12*b*) and applies it to switching power inverter. The power inverter is a full-bridge DC/AC implemented by switches SW1, SW2, SW3 and SW4 and bridge diodes D13 and D18. When diodes D13 and D18 are forward biased by the voltage across winding (12*b*), capacitors C16 and C14 are charged and diode 19 is non-conducting. When the voltage across winding (12*b*) reverses its polarity, capacitor 10 is charged through diode 19, resistor 17, capacitor 16, and switch SW2. Consequently, the voltage across capacitor C10 gradually increases until switch SW11 is closed, and a high voltage pulse is generated to ignite the HID lamp. Under this arrangement, the maximum voltage across capacitor C10 is equal to the sum of the voltage across capacitor C14 and the secondary winding voltage Vin*Np/Ns, where Np and Ns are number of turns of the primary and secondary windings of the flyback transformer, respectively.

The major drawback of ballast of FIG. 2 is that the voltage across capacitor 10 is dependent on the turns ratio Np/Ns of the flyback transformer and ballast input voltage. Also, the voltage across capacitor C10 is usually much lower than twice the voltage across capacitor 14. For example, if Np/Ns=6, Vin=12 V and $V_{C14}$=380 V, then $V_{C10}$=380+6·12=452 V, which is less than two times 380 V or 760 V, the necessary voltage for igniting the HID. Therefore, a large capacitor and a pulse transformer with a high turns ratio are required in order to generate a pulse sufficient to ignite the HID lamp. These requirements could lead to significant increase in the size of the ballast.

FIG. 3 shows yet another prior art ballast for automotive high intensity discharge lamps, which is disclosed in U.S. Pat. No. 6,188,180. The ballast of FIG. 3 includes a switching power inverter 10 implemented by switches Q1, Q2, Q3, and Q4 and an igniter 14 implemented by diodes D1 and D2, capacitors C1 and C2 and a resistor R, which form a voltage doubler. The igniter 14 provides the ignition arc to the lamp during the ignition state and a post processing block 12, which controls the switching of switches Q1-Q4 and its frequency, provides the steady state power to turn on the HIP lamp. During steady state operation of the power inverter, Q1 and Q3 are turned on or off while Q2 and Q4 are turned off or on.

When switch Q2 is turned on at the switching frequency of the power inverter 10, capacitor C2 is charged, through the resistor R and diode D2, to a voltage equal to the ballast input voltage across the terminals +V and −V. When Q1 is turned on, again at the switching frequency of the switching inverter 10, capacitor C1 is charged, though diode D1, by the ballast input voltage across terminals +V and −V, plus the voltage across capacitor C2. Consequently, the voltage across C1 is two times the voltage across terminals +V and −V, which is used to generate a pulse at the primary side and ignite the HIP lamp on the secondary side of the transformer T. In the ballast of FIG. 3, the power inverter 10 and igniter 14 operate at the same switching frequency. One drawback of the ballast of FIG. 3, however, is that the igniter has three input connection pins, and the resistor R only limits the charging current flowing to C2, leaving the peak charging current to C1 dependant on the circuit parasitics.

FIG. 4 shows still another prior art ballast described in “Design and analysis of automotive high intensity discharge lamp ballast using micro-controller unit,” IEEE transactions on Power Electronics, pp. 1356-1364, Vol. 18, No. 6, November 2003. The ballast of FIG. 4 has an igniter that uses a stacked winding to boost the voltage. The required DC input voltage for the igniter is obtained using an extra winding of the flyback transformer Tr1. The voltage across a capacitor Cig, which fires an arc gap, is charged by the voltage across capacitors C1 and C2 via a current limiting resistor Rig., where $V_{Cig}=V_{C1}+V_{C2}$. The major drawback of this approach is the requirement for a four-wire connection between the power PC board (PCB) module and an igniter module. Since a high voltage exists in the stacked winding, special care is also needed for the transformer design, PCB layout, and the insulation of the wire connections between the igniter and power circuit, inevitably increasing the cost.

Therefore, there exists a need for a ballast that is small in size and avoids the drawbacks of the prior art approaches.

SUMMARY OF THE INVENTION

Briefly, a ballast according to the present invention operates in an ignition state, a warm-up state, and a steady state for igniting and powering a lamp. The ballast comprises an igniter that ignites the lamp during the ignition state and a switching power inverter, for example, a full bridge DC-AC inverter implemented with MOSFET switching transistors, that powers the lamp during the warm-up and steady states. The switching power inverter, which drives the igniter, operates at a first switching frequency during the ignition state and operates at a second switching frequency during the steady state. Preferably, the first switching frequency, which in one exemplary embodiment is in the kHz range, is higher than the second switching frequency.

According to some of the more detailed features of the present invention, the ballast of the invention comprises a controller that controls switching frequency of the power inverter. In one embodiment, the igniter comprises a voltage multiplier that multiplies an input voltage to provide a trigger voltage. According to this embodiment, a pulse generator is responsive to the trigger voltage for generating a pulse and a pulse transformer transforms the pulse for igniting the lamp.

According to other more detailed features of the present invention, the igniter comprises a voltage multiplier having at least one charge-pump capacitor and a storage capacitor. During a charge interval, the charge-pump capacitor is charged. During a discharge interval following the charge interval, the charge-pump capacitor is discharged into the storage capacitor at a rate that corresponds to the first switching frequency. A pulse generator is responsive to the accumulated voltage level across the storage capacitor for generating a pulse. A high voltage transformer transforms the pulse from a primary winding to a secondary winding for igniting the lamp. After ignition, the discharge lamp is powered by the switching power inverter, which operates at the second switching frequency. Preferably, the capacitance of the storage capacitor larger than the at least one charge-pump capacitor. According to one embodiment, a diode across a charge-pump capacitor prevent its voltage from going negative, thereby speeding up energy storage in the storage capacitor.

DETAILED DESCRIPTION OF THE INVENTION

Figure 1:
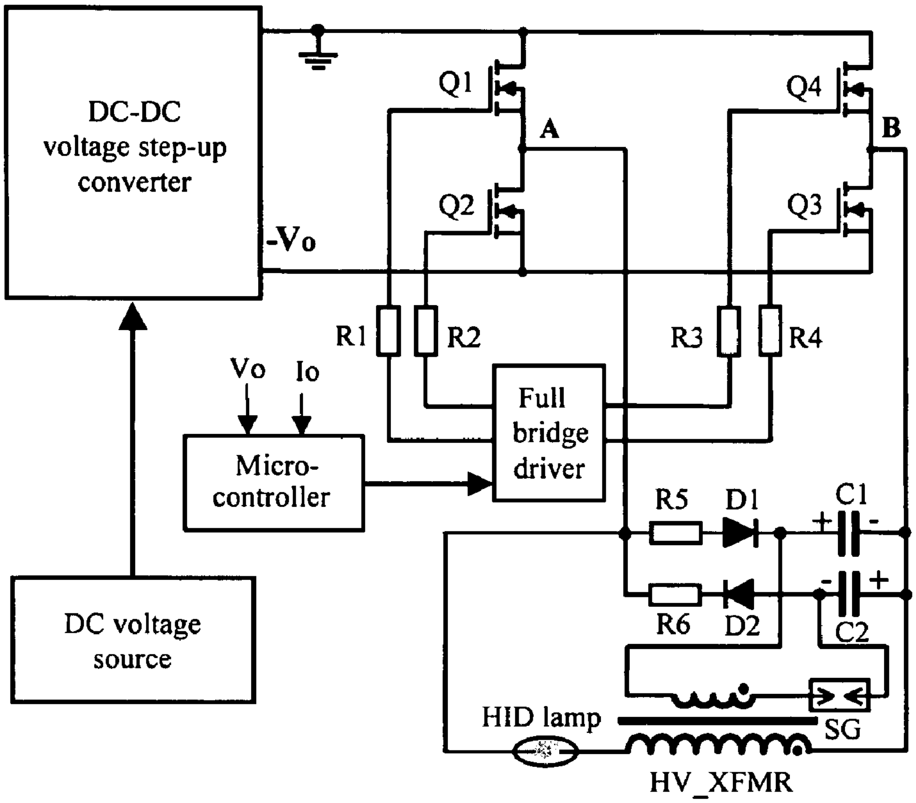
Prior Art Figure 1
FIGS. 1-4 shows various types of prior art ballasts.
Figure 2:
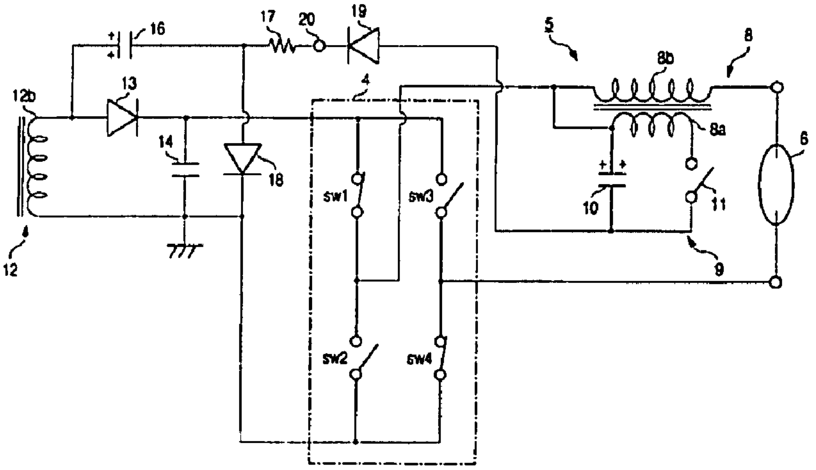
Prior Art Figure 2
Figure 3:
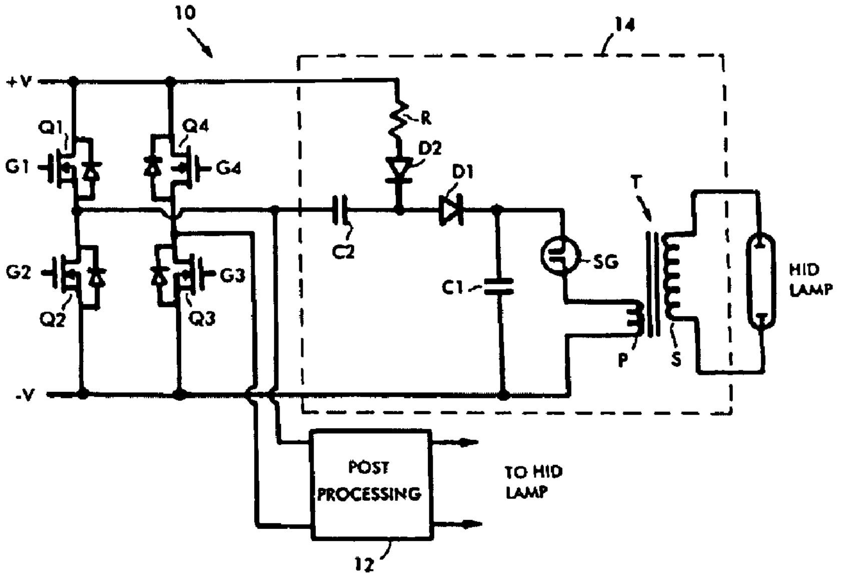
Prior Art Figure 3
Figure 4:
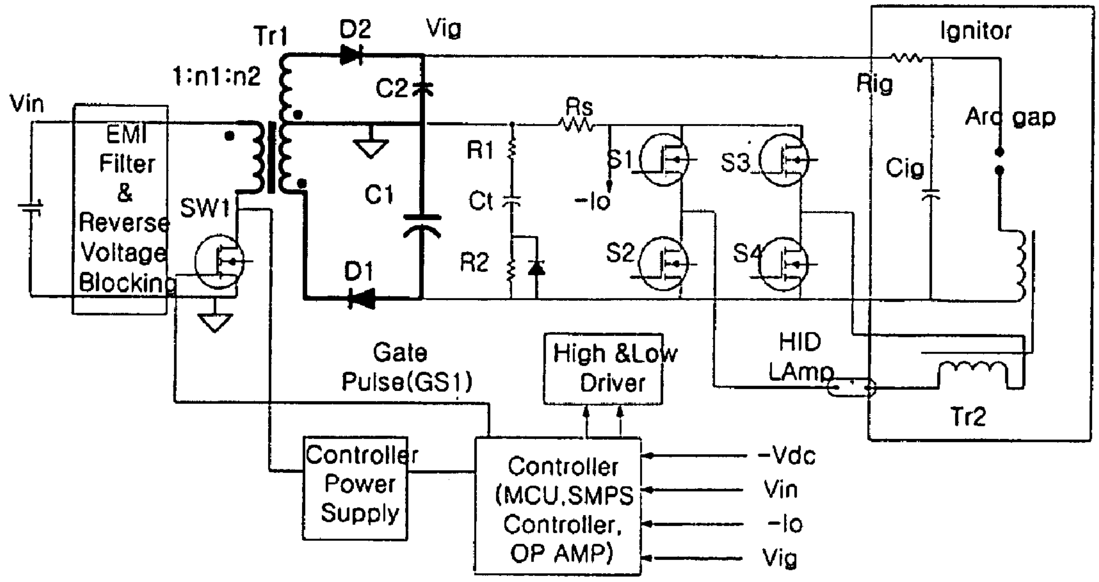
Prior Art Figure 4

A ballast according to the present invention ignites and powers a lamp during an ignition state, warm-up state, and steady state, respectively. In the exemplary embodiment, the lamp comprises an HID lamp. However, the present invention can be applied to any lamp, which provides lighting by operating in ignition, warm-up, and steady states.

The ballast of the invention comprises an igniter that ignites the lamp during the ignition state and a switching power inverter, such as a full-bridge DC/AC inverter, which drives the igniter and after ignition, powers the lamp. The ballast of the invention can incorporate a wide variety of switching power inverters, such as a half-bridge inverter and full-bridge inverter. In one exemplary embodiment, the igniter comprises a voltage multiplier having capacitors for pumping charge and storing voltage. Such capacitors can include a small charge-pump capacitor and a relatively larger storage capacitor. The voltage multiplier also includes switching diodes and one or more resistors for limiting the charge/discharge currents. The igniter also has a pulse generator, such as a spark gap or a switch, which is responsive to the stored voltage in the storage capacitor and a pulse transformer for generating a high voltage pulse that ignites the lamp.

At its simplest form the voltage multiplier used in the present invention is a voltage doubler. However, the present invention can accommodate voltage triplers, quadruplers as well as n-stage cascaded multipliers, n being an integer, as described and shown further below. In another exemplary embodiment, a diode is used to shorten the time required for charging the storage capacitor to the break-over voltage of the spark gap.

As stated above, prior art ballasts use the same switching frequency for igniting and powering the HID lamp. According to one of the feature of the invention, the power inverter operates at different switching frequencies during the ignition and steady states. Such switching frequencies comprise at least two frequencies: a first switching frequency during the ignition state for driving the igniter and a second switching frequency for powering the HID lamp during the steady state. Preferably, the first switching frequency is higher than the second switching frequency, which results in appreciable reduction in the sizes of the charge-pump and storage capacitors. A micro-controller or an analog circuit generates a control signal that sets the switching frequency of the power inverter appropriately during each operating states.

Unlike prior approaches, the ballast of the present drives the igniter by a switching power inverter that can be set to provide different switching frequencies depending on the operating state of the HID lamp. Therefore, compared to prior art ballasts, the present invention increases the effective capacitance and reduces the overall size of the igniter without lowering the voltage pulse. Furthermore, the switching frequency is synchronized with the firing of the spark gap, resulting in a superposed voltage equal to the power inverter input voltage plus the voltage generated by the pulse transformer across the HID lamp. Also, only two leads are necessary for connecting the inverter to the igniter, simplifying ballast packaging.

Figure 5:
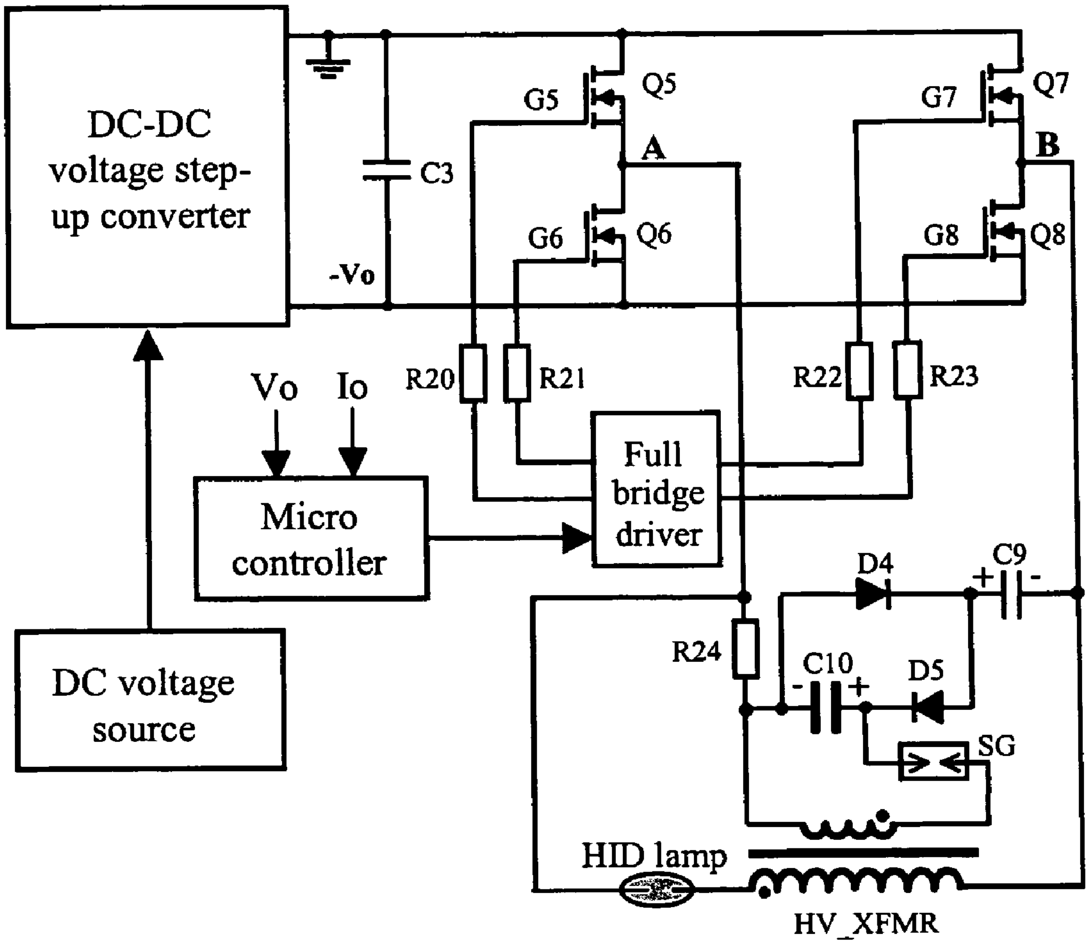
FIG. 5 shows a ballast according to one exemplary embodiment of the present invention.

FIG. 5 shows an exemplary embodiment of the ballast of the present invention. The ballast comprises a switching power inverter implemented with switching transistors Q5-Q8 and a full-bridge driver. The switching transistors Q5-Q8 are preferably MOSFETs having anti-parallel diodes, the gates of which, G5-G8, are controlled by a micro-controller, which sets the switching frequency of the power inverter. The ballast of the invention also includes an igniter comprising a voltage multiplier coupled to a pulse generator, e.g., spark gap SG, that generates a high voltage ignition pulse via a pulse transformer HV-XFMR. The voltage multiplier of FIG. 5 is a voltage doubler comprising a current limiting resistor, R24, two diodes D4 and D5, two capacitors, C9 and C10, with capacitor C10 having a capacitance larger than capacitor C9. For example, capacitor C10 can have a capacitance in the range of 100 nF to 470 nF whereas the capacitance of capacitor C9 can be in the range of 1 nF to 47 nF. This arrangement reduces the igniter size by requiring a smaller capacitor C9. Capacitor C9 functions as a charge-pump capacitor and capacitor C10 functions as a storage capacitor for storing charge/energy/voltage. After ignition, the lamp, which is connected in series with the secondary winding of the pulse transformer HV_XFMR, is powered by the full-bridge switching power inverter output.

The voltage multiplier of FIG. 5, a voltage doubler, as described later in detail, provides an ignition trigger voltage by charging capacitor C9 during a charge time interval, $T_{charge}$, and discharging it into capacitor C10 during a discharge interval, $T_{discharge}$. The charge and discharge time intervals correspond to the first switching frequency at which the power inverter operates during the ignition state. When Q5 and Q8 are turned on during the charge time interval, $T_{charge}$, diode D4 is forward biased, capacitor C9 is charged through the current flowing through R24 and D4. The charge time interval, $T_{charge}$, that charges capacitor C9 up to 99% of the ballast input voltage Vo or about $5 \cdot R24 \cdot C9$. For example, for C9=10 nF and R24=2.2 kΩ, the charge time interval, $T_{charge}$, would be about 110 μs. Since the discharge time interval, $T_{discharge}$, of capacitor C9 is also mainly determined by the values of R24 and C9, the switching frequency (or period) of the power inverter corresponds to $2 \cdot T_{charge}$ or $2 \cdot T_{discharge}$, which is 220 μs. By lowering the capacitance of capacitor C9, a higher the switching frequency would be necessary to charge C9, and vice versa.

When Q6 and Q7 are turned on during the discharge time interval, $T_{discharge}$, diode D5 is forward biased and capacitor C10 is charged by the current flowing through R24 and D5, which discharges capacitor C9. As a result, after each switching period, the voltage across capacitor C10 accumulates until it reaches a break-over trigger voltage at approximately twice the ballast input voltage Vo when the spark gap, SG, is turned on generating an ignition pulse. The ignition pulse is applied to the primary winding of the high voltage transformer resulting in a higher voltage ignition pulse across the secondary winding of the high voltage transformer, which ignites the lamp.

It would be appreciated that as the charge-pump capacitor C9 charges and discharges, voltage accumulates across the storage capacitor C10 to generate the trigger voltage. In order to store voltage in the storage capacitor C10 using a smaller capacitor C9, the power switching inverter should operate at a higher frequency during the ignition state than during the steady state, when it powers the lamp to turn it on. The micro-controller shown in FIG. 5 is programmed appropriately in a well-known manner to set the suitable switching frequency during the ignition state and steady state. At the steady state, the switching frequency of the power inverter as set by the micro-controller is typically in the range of 100 Hz-500 Hz. In order to fully charge C10 with the charge of the smaller charge-pump capacitor C9, the switching frequency of the power inverter may be chosen to be around $1/(2 \cdot T_{charge})$, which is typically in the kHz range (compared to Hz range in the steady state). The micro-controller can be made responsive to the ballast input voltage Vo and/or Io (current output) for setting the proper switching frequency during ignition state and steady state. Since the firing of the spark gap is synchronized with the turn on time of switches Q6 and Q7, the secondary winding can be arranged so that the voltage applied to the lamp at the moment of the break-over of the spark gap is equal to the sum of the voltage Vo and the high voltage across the secondary winding of high voltage transformer, thereby optimizing power efficiency.

Figure 6A:
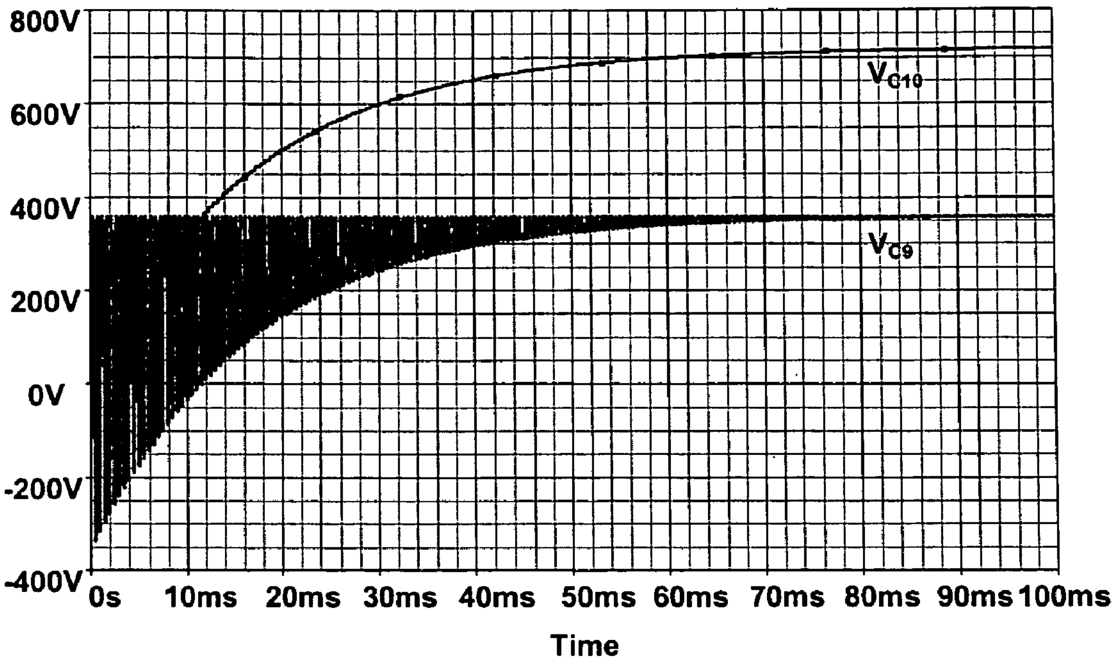
FIGS. 6(*a*)-(*b*) and 7(*a*)-(*b*) show simulated igniter waveforms for the ballast of FIG. 5 operating at different exemplary switching frequencies.
Figure 6B:
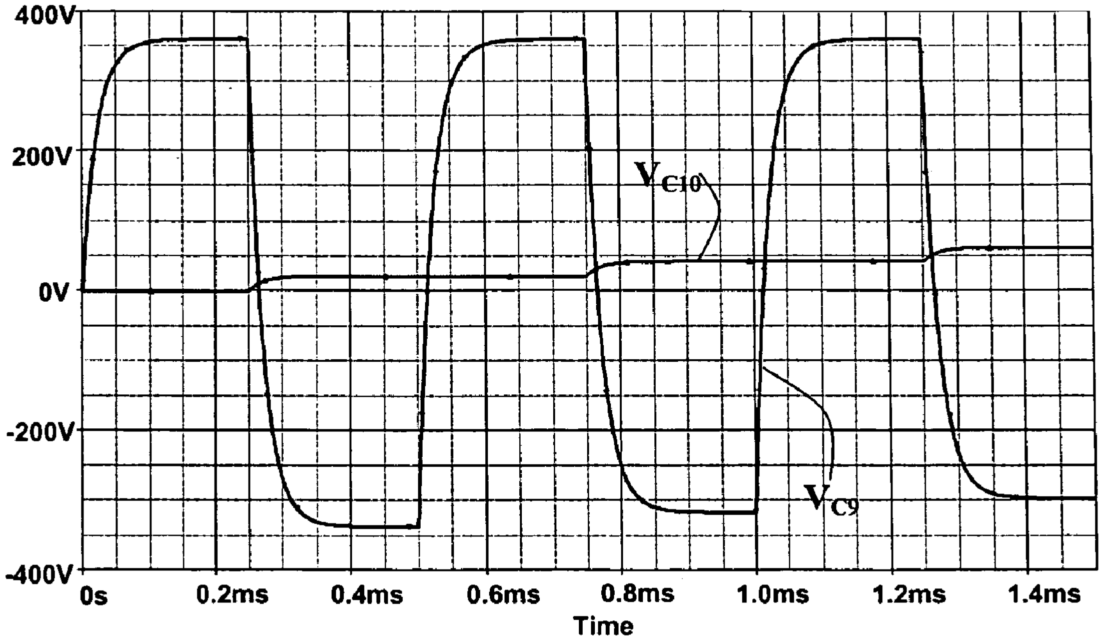
Figure 7A:
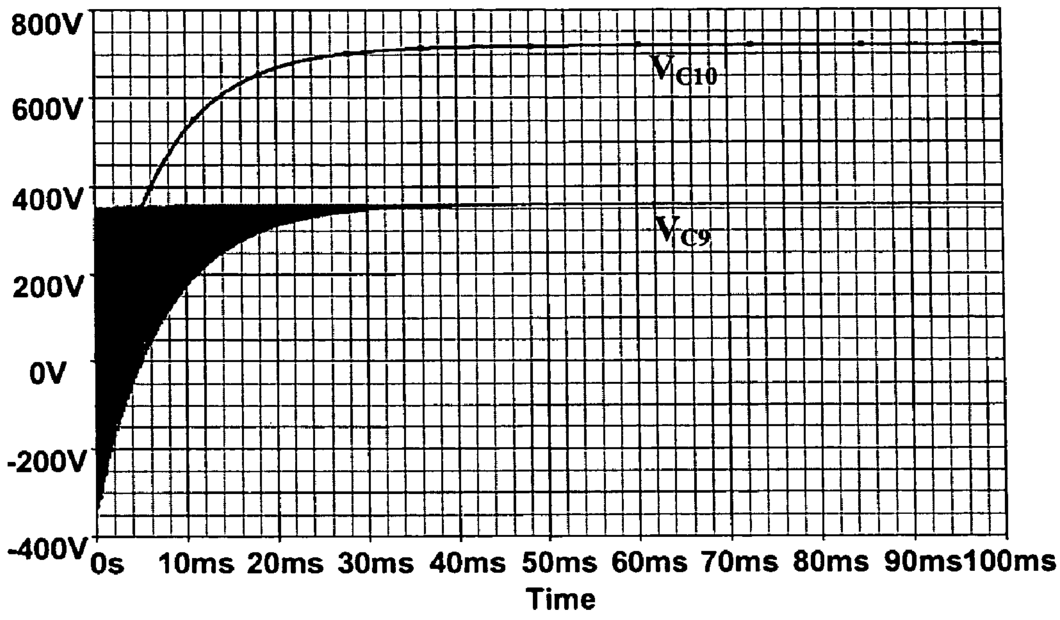
Figure 7B:
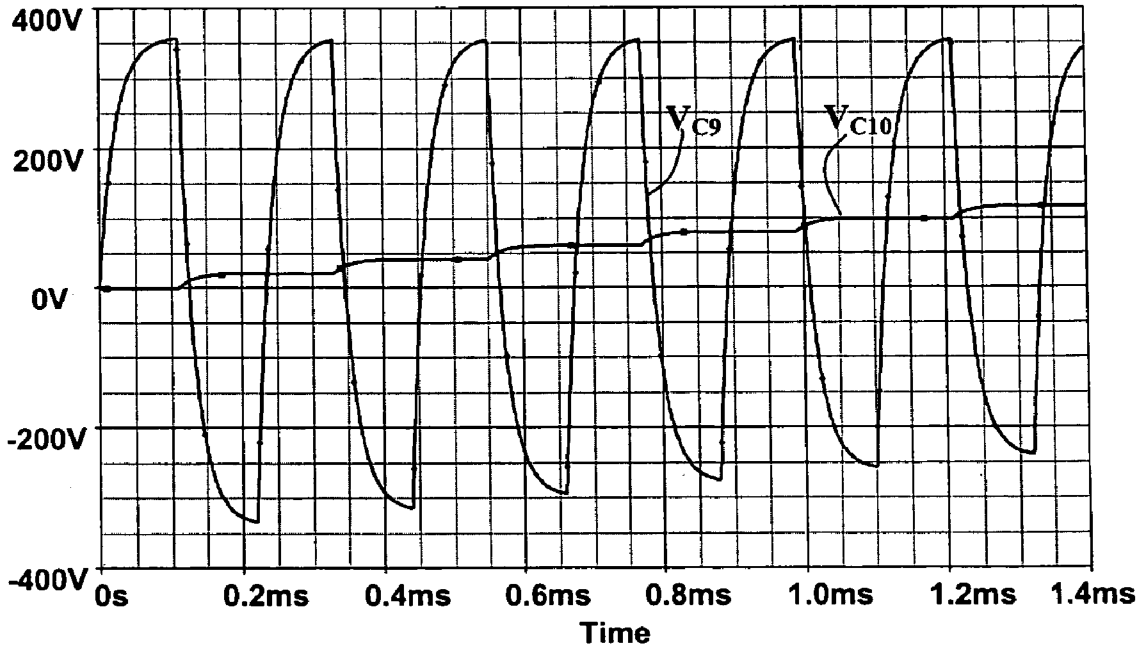

FIGS. 6(*a*) and (*b*) show exemplary simulated waveforms of capacitors C9 and C10 of present invention with C9=10 nF, C10=330 nF, R24=2.2 kΩ, Vo=360V, and switching frequency of 2 kHz. As shown in FIG. 6(*b*), the voltage across capacitor C10 increases in a step-like fashion each time capacitor C9 is discharged. The charging voltage for C10 is the Vo voltage across capacitor C3 plus the voltage across C9. FIG. 6(*a*) shows that it takes about 90 ms for the capacitor C10 to be charged up to the maximum voltage, 710 V, which is twice the Vo voltage. However, if the switching frequency of the inverter is chosen to be around $1/(2\cdot T_{charge})$, which is 4.5 kHz, the time for capacitor C10 to be fully charged is only 52 ms, as shown in FIGS. 7(*a*) and 7(*b*).

Figure 8:
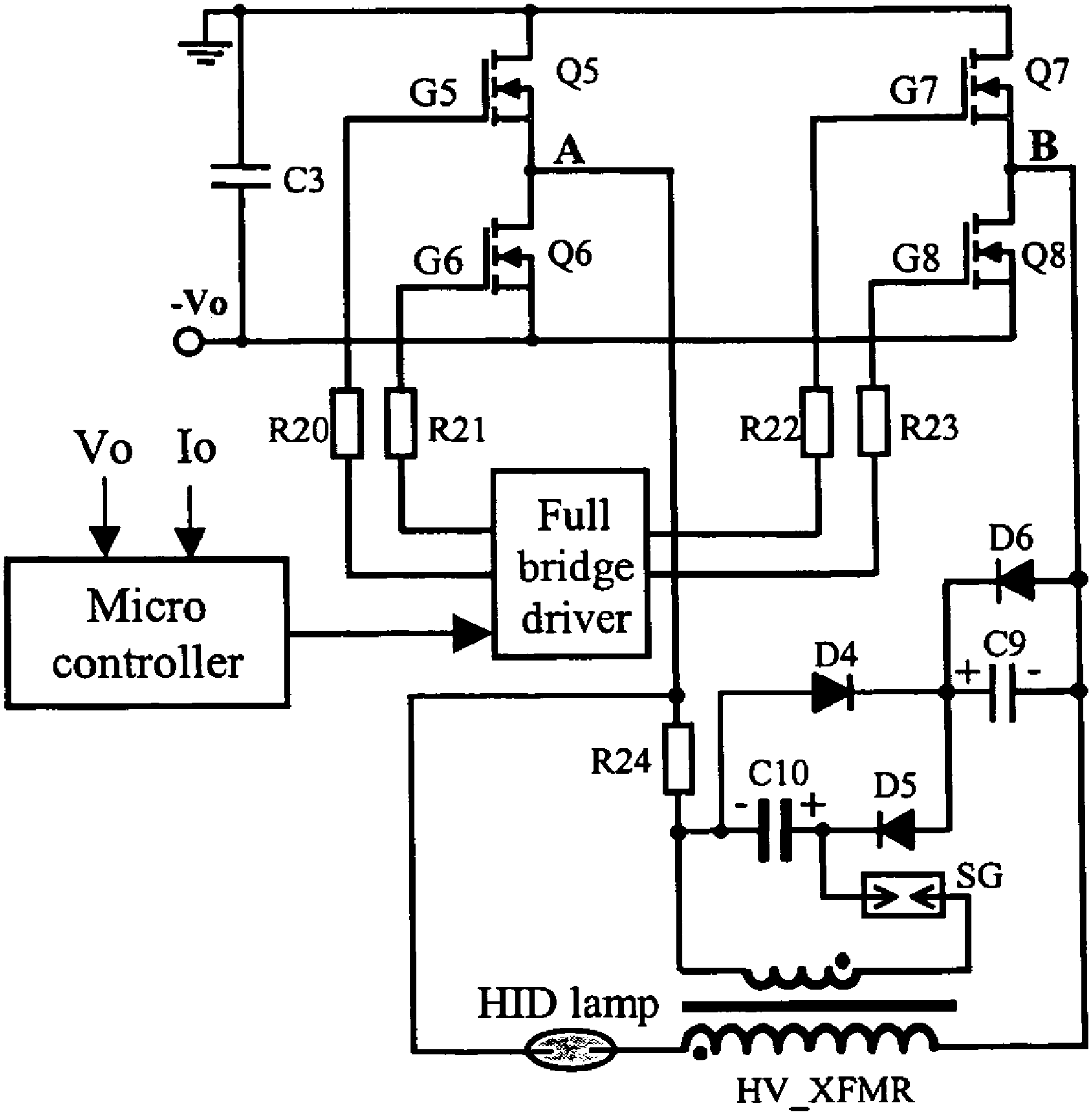
FIG. 8 shows a ballast according to another exemplary embodiment of the present invention.
Figure 9A:
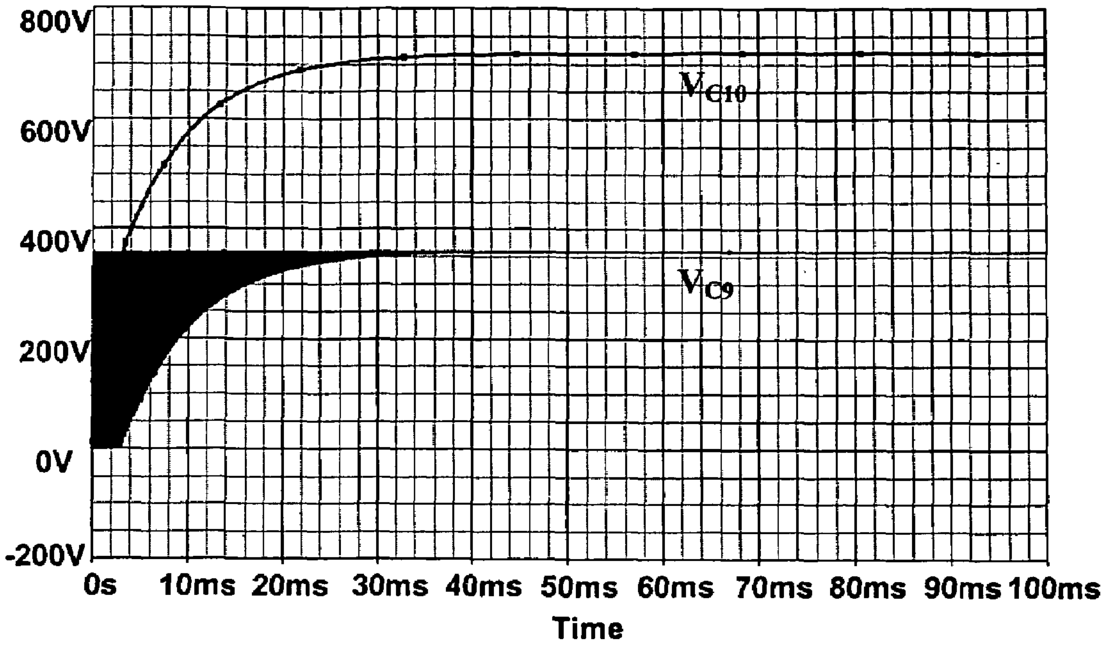
FIGS. 9(*a*)-(*b*) show simulated waveforms for the ballast of FIG. 8 operating at an exemplary switching frequency.
Figure 9B:
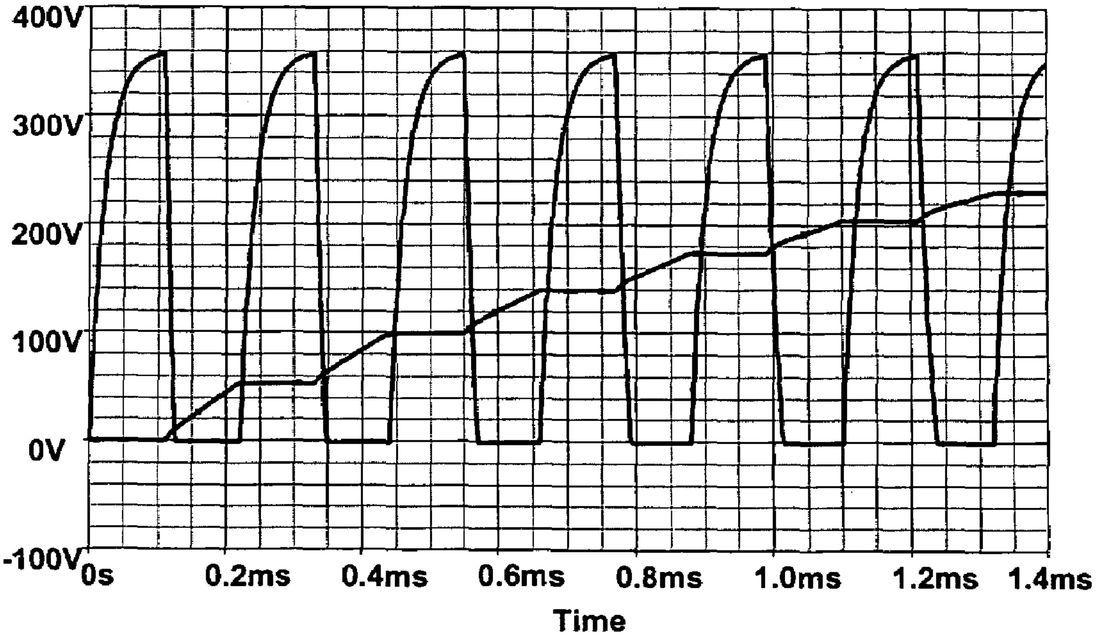

FIGS. 6(*b*) and 7(*b*) illustrate that during the initial phase of C10 charging, i.e., when the voltage drop across capacitor C10 is only a small portion of the ballast input voltage Vo, which is determined by the divider ratio of C9/(C9+C10), the voltage across capacitor C9 discharges to a negative value. In order to prevent the voltage across capacitor C9 from becoming negative, and further increase the averaged voltage across capacitor C9 as well as the voltage across capacitor C10, a diode D6 can be placed across capacitor C9, as shown in FIG. 8. With diode D6 connected across C9, the voltage across C9 is prevented from going negative as shown in FIGS. 9(*a*) and 9(*b*). At the same time initial increase of voltage across C10 is much faster and its charging time is shortened compared to the case without diode D6, as can be seen by comparing FIGS. 7(*a*) and 9(*a*).

Figure 10:
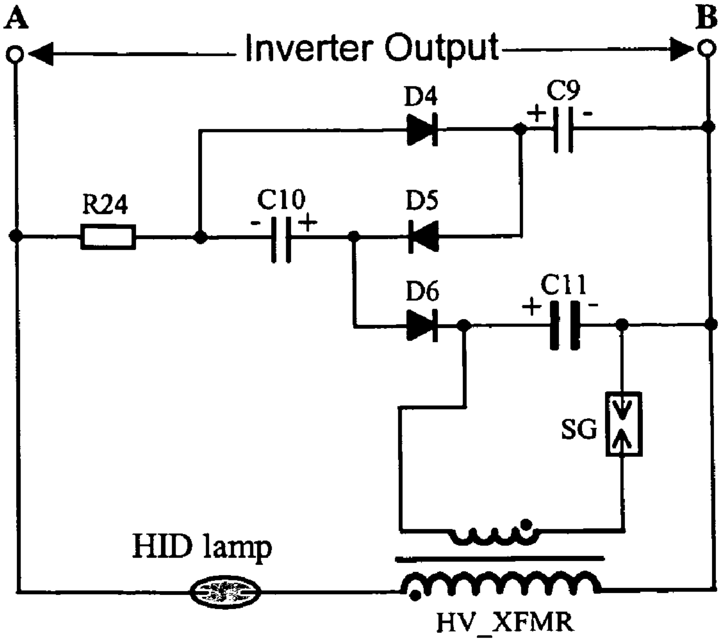
FIG. 10 shows an exemplary igniter having a voltage tripler for a ballast according to the present invention.
Figure 11:
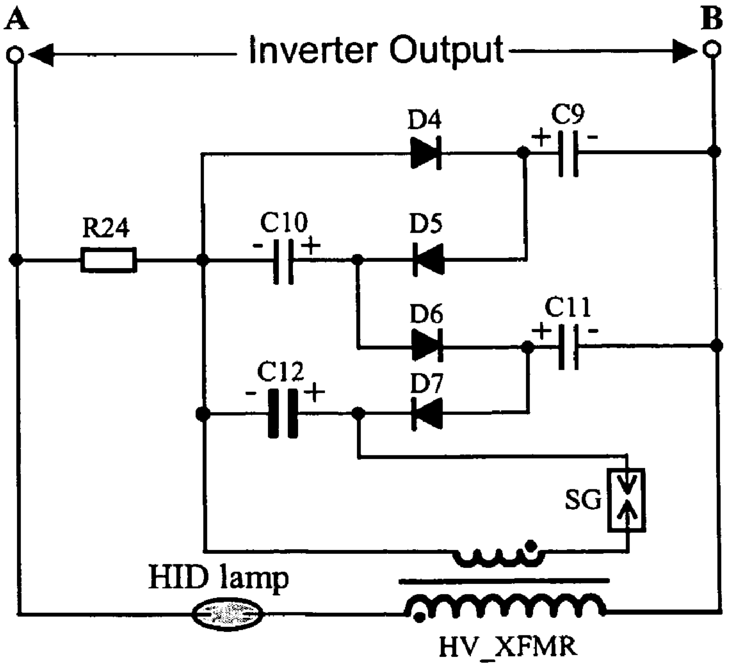
FIG. 11 shows an exemplary igniter having a voltage quadrupler for a ballast according to the present invention.
Figure 12:
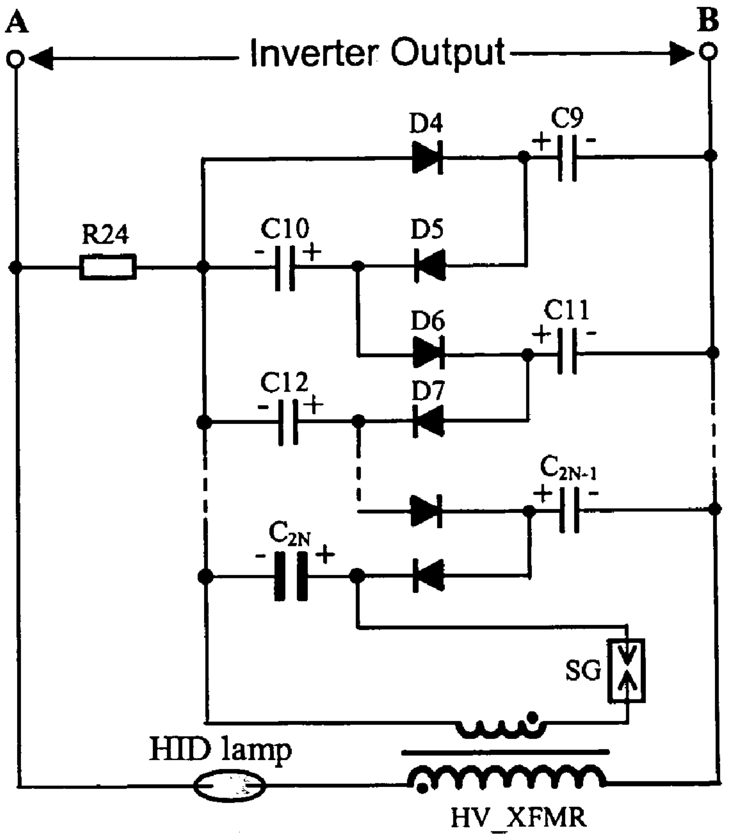
FIG. 12 shows waveforms for the voltage quadrupler shown in FIG. 11 operating at an exemplary switching frequency.
Figure 13:
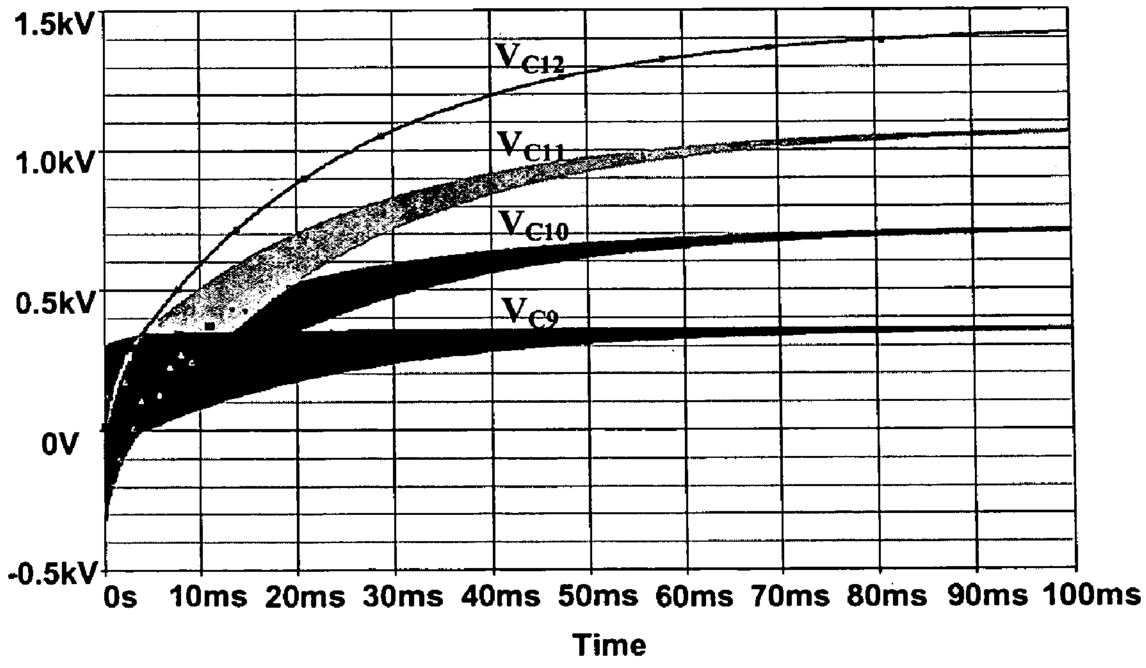
FIG. 13 shows an exemplary igniter having an n-stage voltage multiplier for a ballast circuit according to the present invention.

Although FIG. 5 shows the igniter of the ballast circuit as comprising a voltage doubler, the present invention can be extended to an igniter with a voltage tripler, or a voltage quadrupler, or a voltage multiplier with a voltage of n times the ballast input voltage Vo, as shown in FIGS. 10-12, respectively. FIG. 10 shows a voltage tripler for the igniter of the present invention. Under this arrangement, capacitors C9 and C10 function as the smaller charge-pump capacitors and capacitor C11, which is coupled to the spark gap, SG, functions as the larger storage capacitor. During the charge interval, $T_{charge}$, C9 gets charged and then discharges into C10 during the discharge interval, $T_{discharge}$, which functions as the charge-pump capacitor for the storage capacitor C11. As the switching periods continue C9 charges and discharges into C10, which itself discharges into C11, which accumulates the break-over voltage at 3*Vo for triggering the spark gap SG. FIG. 11 shows a voltage quadrupler for the igniter of the present invention, which operates according to similar principals as FIG. 10 for accumulating the break-over voltage at 4*Vo for triggering the spark gap SG. FIG. 12 show an n-times voltage multiplier for accumulating the break-over voltage at n*Vo, where n is an integer. As can be seen, the voltage multiplier according to the configuration of FIGS. 10-12 all have a common feature that only the last storage capacitor which is directly connected to the spark gap, or any other type of switch or pulse generator, and the primary winding of the pulse transformer has a higher capacitance than the previous charge pump capacitors, which have smaller capacitances. With a voltage multiplier having an output voltage at least three times (or four times or n times) the amplitude of the ballast input voltage, a spark gap (or any other type of switch or pulse generator) with a higher break-over voltage can be used. In addition, the pulse transformer turns ratio and size can be further reduced as well as the size of the storage capacitor. FIG. 13 shows the simulated voltage waveforms of capacitors in a voltage quadrupler of present invention with an inverter switching frequency of 4.5 kHz, C9=C10=C11=10 nF, C12=330 nF, and R24=2.2 kΩ. It can be seen that the voltage across C12 is boosted to 1 kV within only 26 ms.

Figure 14:
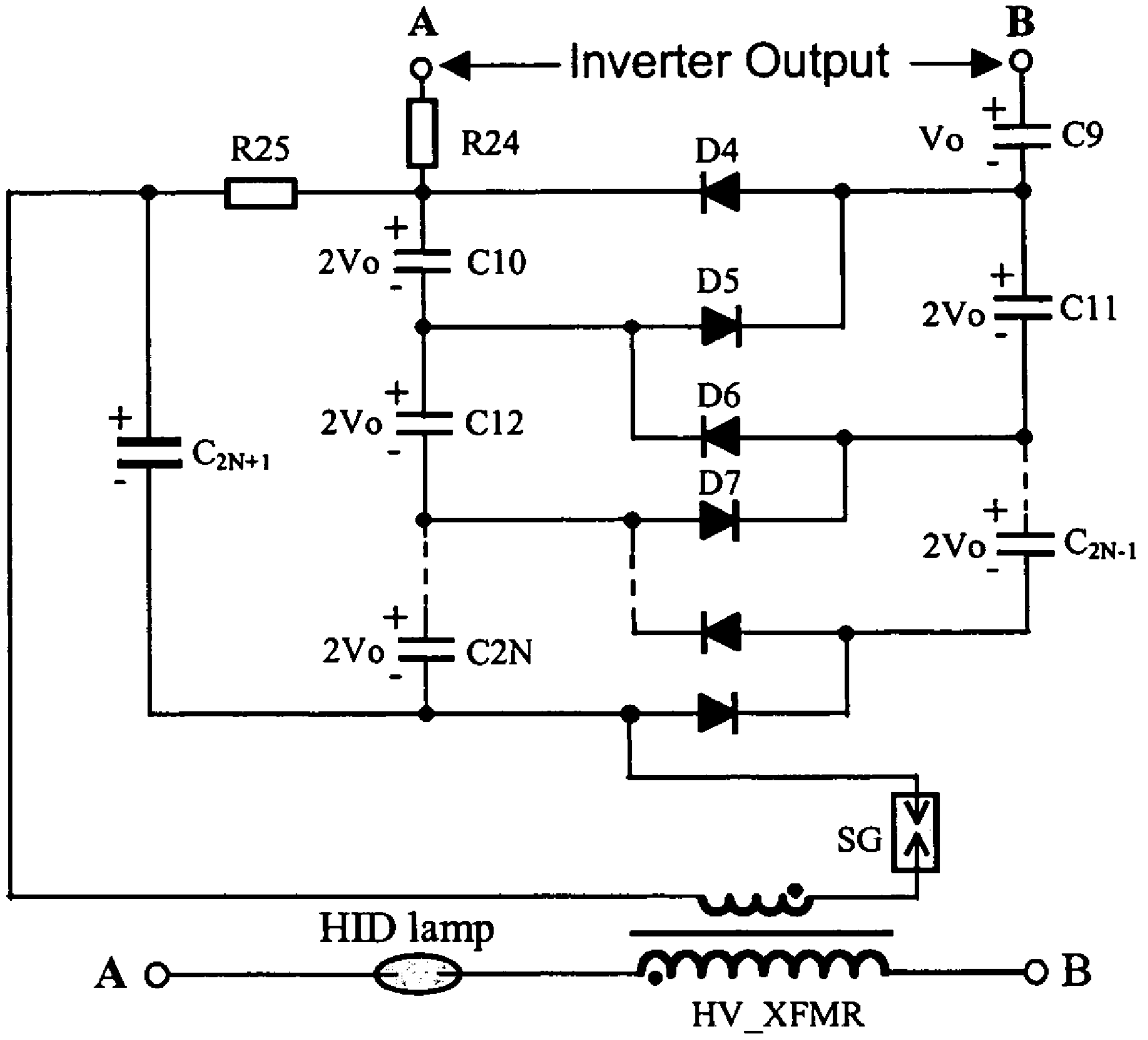
FIG. 14 shows another configuration for the igniter shown in FIG. 13.

The voltage multiplier of the present invention for an igniter driven by a variable switching frequency inverter is not restricted to the multiplier shown in FIG. 10-12. FIG. 14 shows another configuration for a voltage multiplier used in the igniter of the present invention. The capacitors C9-C2N have a small capacitance while storage capacitor $C_{2N+1}$ has a higher capacitance to store the energy needed to generate a high voltage pulse.

When the voltage at node B is higher than that at node A, diode D4 is forward biased, capacitor C9 is charged to a voltage, which is Vo, via resistor R24. When the voltage at node B is lower than that at node A, diode D5 is forward biased, capacitor C10 is charged to a voltage equal to the sum of Vo at the inverter output and the voltage across capacitor C9, which is 2 Vo. When the inverter output reverses its polarity again, diode D6 is forward biased, capacitor C11 is charged to a voltage, 2 Vo, which is the result of 2 Vo (across C10)+Vo (inverter output)−Vo (across C9). The same voltage, 2 Vo, can be obtained across each of the rest capacitors in a similar manner. The voltage across capacitor $C_{2N+1}$ depends on how many small capacitors and diodes are used. A total voltage of n*Vo can be achieved across capacitors C10 to C2*N, with n small capacitors and n diodes configures as shown in FIG. 14. The capacitor $C_{2N+1}$ is finally charged up to a voltage of n*Vo via current limiting resistor R25. The advantage of this voltage multiplier is that all the small capacitors can have a low voltage rating (at least 2*Vo), only the capacitor storing the energy requires a high voltage rating, which should at least n*Vo.

Based on the foregoing, it would be appreciated that the ballast of the present invention has an igniter for a lamp with a multiplier having cascaded capacitor stages, where only one relatively larger capacitor is required to store the energy, while the rest of the capacitor(s) of the one or more previous cascaded stages can have lower capacitance, thereby resulting in appreciable size reduction of the igniter. The ballast of the invention is driven by a power inverter that operates at different switching frequencies depending on the operating state of the lamp. The switching frequency depends on the capacitance(s) of one or more smaller capacitors, which temporarily store the energy and pump the charge to a larger storage capacitor. A higher switching frequency results in a smaller capacitance, hence a reduced size, also a shorter time for the lamp to be ignited. The turn on of the full-bridge switch is also synchronized with the firing of the spark gap or any other switch or pulse generator, which enables the proper winding arrangement of the pulse transformer so that a high ignition voltage, which is the sum of the Vo voltage and the pulse voltage, is applied to the lamp. As a result, only two connections between the igniter and the power inverter are required, simplifying the packaging. With any type of voltage multiplier and the proposed variable switching frequency approach, a lamp igniter which can generate essentially any high voltage pulse can be realized at a relatively small size.

The invention claimed is:

1. A ballast for igniting and powering a discharge lamp that operates in at least one of an ignition state and a steady state, comprising:

an igniter having a current limiting resistor and a charge pump capacitor for igniting the discharge lamp during the ignition state; and a switching power inverter operating at a first switching frequency for driving the igniter during the ignition state and operating at a second switching frequency that is different from the first switching frequency for powering the lamp during the steady state, wherein the first switching frequency is based on the current limiting resistor and charge pump capacitor.

2. The ballast of claim 1, wherein the first switching frequency is higher than the second switching frequency.

3. The ballast of claim 1, wherein the first switching frequency is in the kHz range.

4. The ballast of claim 1 further comprising a controller that controls switching frequency of the power inverter.

5. The ballast of claim 1, wherein the igniter comprises:

a voltage multiplier that multiplies an input voltage to provide a trigger voltage;

a pulse generator that is responsive to the trigger voltage for generating a pulse; and a pulse transformer that transforms the pulse for igniting the lamp.

6. The ballast of claim 5, wherein the voltage multiplier comprises at least one charge-pump capacitor and a storage capacitor, wherein the at least one charge-pump capacitor is charged during a charge time interval and discharged into the storage capacitor during a discharge interval, wherein said charge and discharge time intervals correspond to the first switching frequency.

7. The ballast of claim 6, wherein the capacitance of the storage capacitor larger than that of the at least one charge-pump capacitor.

8. The ballast of claim 6 further including a diode across the at least one charge-pump capacitor to prevent the voltage across the at least one charge-pump capacitor from going negative.

9. The ballast of claim 1, wherein the power inverter comprises a full bridge DC-AC inverter.

10. The ballast of claim 7, wherein the full bridge DC-AC inverter is implemented with MOSFET switching transistors.

* * * * *